(12) United States Patent
Abe

(10) Patent No.: US 10,315,261 B2
(45) Date of Patent: Jun. 11, 2019

(54) WIRE ELECTRICAL DISCHARGE MACHINE AND MEASURING METHOD

(71) Applicant: FANUC CORPORATION, Yamanashi (JP)

(72) Inventor: Hiroyuki Abe, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 122 days.

(21) Appl. No.: 15/676,113

(22) Filed: Aug. 14, 2017

(65) Prior Publication Data

US 2018/0056420 A1 Mar. 1, 2018

(30) Foreign Application Priority Data

Aug. 24, 2016 (JP) .................................. 2016-163387

(51) Int. Cl.
*B23H 7/00* (2006.01)
*B23H 7/10* (2006.01)
(Continued)

(52) U.S. Cl.
CPC ............... *B23H 7/10* (2013.01); *B23H 1/022* (2013.01); *B23H 1/06* (2013.01); *B23H 7/04* (2013.01);
(Continued)

(58) Field of Classification Search
CPC .......... B23H 1/02; B23H 1/022; B23H 1/024; B23H 1/06; B23H 7/02; B23H 7/04;
(Continued)

(56) References Cited

U.S. PATENT DOCUMENTS 5,744,775 A * 4/1998 Yasuda .................... B23H 7/04
219/69.12
5,852,269 A * 12/1998 Toyonaga .............. B23H 7/065
219/69.12
(Continued)

FOREIGN PATENT DOCUMENTS

EP 0685286 A1 12/1995
JP 56139836 A 10/1981
(Continued)

OTHER PUBLICATIONS

Extended European Search Report dated Feb. 2, 2018 for related EP Application No. 17001402.1, 7 pgs.
(Continued)

*Primary Examiner* — Hung D Nguyen
(74) *Attorney, Agent, or Firm* — Fredrikson & Byron, P.A.

(57) ABSTRACT

A wire electrical discharge machine includes: a supporting member for relatively moving a wire electrode relative to a measurement target; servomotors for moving the supporting member; a setting changer for changing the setting of a directive speed; and a motor controller that controls the servomotors in performing move-and-contact detection for detecting contact between the wire electrode and the measurement target by moving the two relative to each other, so that the wire electrode is moved relative to the measurement target based on the directive speed changed and specified by the setting changer.

8 Claims, 10 Drawing Sheets

(51) Int. Cl.
*B23H 1/02* (2006.01)
*B23H 1/06* (2006.01)
*B23H 7/36* (2006.01)
*B23H 7/04* (2006.01)
*B23H 7/26* (2006.01)
*G01R 1/00* (2006.01)

(52) U.S. Cl.
CPC ............... *B23H 7/102* (2013.01); *B23H 7/26* (2013.01); *B23H 7/36* (2013.01); *G01R 1/00* (2013.01); *B23H 2300/22* (2013.01); *B23H 2400/10* (2013.01); *B23H 2500/20* (2013.01); *G05B 2219/43065* (2013.01); *G05B 2219/45043* (2013.01)

(58) Field of Classification Search
CPC . B23H 7/06; B23H 7/065; B23H 7/10; B23H 7/101; B23H 7/102; B23H 7/104; B23H 7/105; B23H 7/107; B23H 7/20; B23H 7/26; B23H 7/36; B23H 2300/22; B23H 2500/20; G01R 1/00; G05B 2219/45043; G05B 2219/43065
USPC ..................... 219/69.12, 69.13, 69.15, 69.17
See application file for complete search history.

(56) References Cited

U.S. PATENT DOCUMENTS

| | | |
|---|---|---|
| 5,854,544 A | 12/1998 | Speth et al. |
| 2003/0155881 A1 | 8/2003 | Hamann et al. |
| 2005/0072760 A1* | 4/2005 | Abe ........................ B23H 7/02 219/69.12 |

FOREIGN PATENT DOCUMENTS

| | | |
|---|---|---|
| JP | 7314254 A | 12/1995 |
| JP | 2004314191 A | 11/2004 |
| JP | 4027834 B2 | 12/2007 |
| WO | 2012140723 A1 | 10/2012 |

OTHER PUBLICATIONS

English Abstract and Machine Translation for Japanese Publication No. 4027834 B2, published Dec. 26, 2007, 10 pgs.
English Abstract for Japanese Publication No. JPH 07-314254 A, published Dec. 5, 1995, 2 pgs.
English Abstract and Machine Translation for Japanese Publication No. 2004-314191 A, published Nov. 11, 2004, 12 pgs.
English Abstract and Machine Translation for International Publication No. JP/WO 2012140723 A1, published Oct. 18, 2012, 15 pgs.
English Abstract and Machine Translation for Japanese Publication No. 56-139836 A, published Oct. 31, 1981, 6 pgs.
English Machine Translation of Notification of Refusal dated Jul. 24, 2018 for related Japanese Application No. 2016-163387, 3 pgs.
Untranslated Notification of Refusal dated Jul. 24, 2018 for related Japanese Application No. 2016-163387, 3 pgs.
English Machine Translation of Decision to Grant dated Sep. 25, 2018 for related Japanese Application No. 2016-163387, 3 pgs.
Untranslated Decision to Grant dated Sep. 25, 2018 for related Japanese Application No. 2016-163387, 3 pgs.

\* cited by examiner

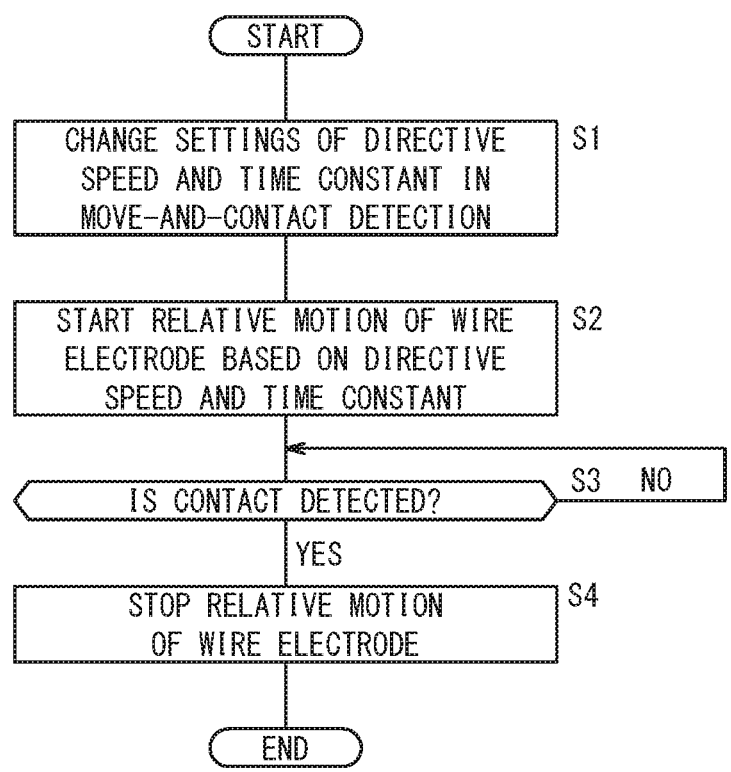

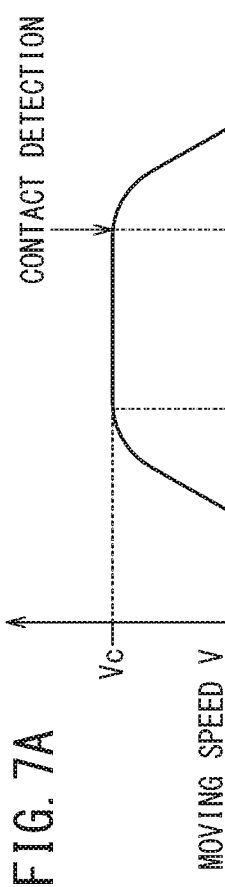
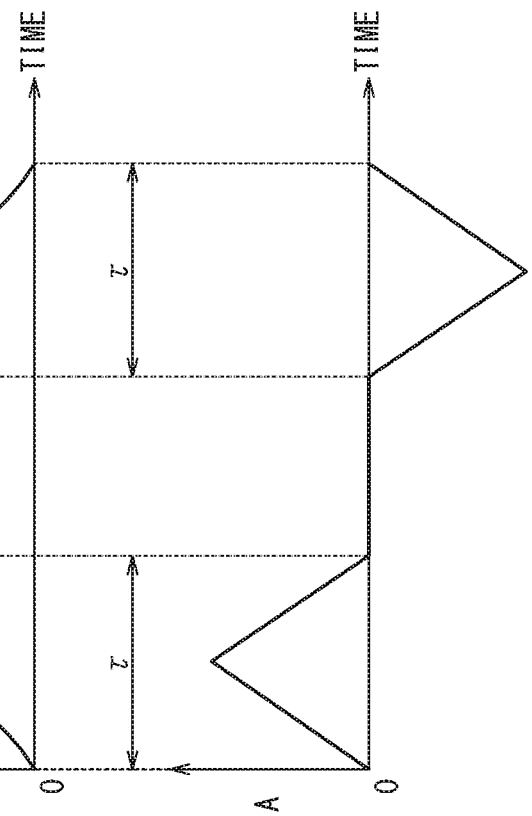
FIG. 7A
FIG. 7B

WIRE ELECTRICAL DISCHARGE MACHINE AND MEASURING METHOD

CROSS-REFERENCE TO RELATED APPLICATION

This application is based upon and claims the benefit of priority from Japanese Patent Application No. 2016-163387 filed on Aug. 24, 2016, the contents of which are incorporated herein by reference.

BACKGROUND OF THE INVENTION

Field of the Invention

The present invention relates to a wire electrical discharge machine that performs positioning of a wire electrode and shape measurement of an object to be measured by detecting contact between the wire electrode and the measurement target while moving the wire electrode supported by upper and lower wire guides relative to the measurement target, as well as relating to a measuring method for the wire electrical discharge machine.

Description of the Related Art

In the wire electrical discharge machine, positioning of the wire electrode and shape measurement of a measurement target can be performed based on the relative position between the wire electrode and the measurement target when the two come in contact with each other (which will be referred to, hereinbelow, as "contact position") as they are moved relatively.

For example, Japanese Laid-Open Patent Publication No. 07-314254 discloses a method of centering a machining start hole in a wire electrical discharge machine. Briefly explaining, first, a wire electrode is inserted into the machining start hole formed in a workpiece as a measurement target, three or more contact points of the wire electrode with the inner wall of the hole are determined to calculate the center of the circle defined by the determined three contact points. The thus calculated center is assumed to be the center position of the hole formed in the workpiece, and the wire electrode and the workpiece are relatively moved so that the position of the wire electrode coincides with the calculated center position. Thus, the wire electrode is positioned.

A typical wire electrical discharge machine has two modes as to relative motion between the wire electrode and the workpiece, namely "cutting feed" mode to be used for electrical discharge machining and "rapid traverse" mode for positioning.

Japanese Patent No. 4027834 discloses a configuration in which the workpiece is moved relative to the wire electrode in rapid traverse (at a rapid traverse rate of 4 to 8 m/min) so as to position the wire electrode based on the contact position. Herein, even if the workpiece is stopped right after detecting its contact with the wire electrode, a delay occurs in stopping the motion of the workpiece due to control response and/or inertia. For this reason, the wire electrode thrusts into the workpiece, making it impossible to acquire the true contact position with high precision.

To deal with this, in Japanese Patent No. 4027834, when the wire electrode and the workpiece are brought into contact, the workpiece is stopped and returned by a predetermined distance so that the wire electrode separates from the workpiece. Then, once again, the workpiece is moved at a feed speed (0.5 to 6 mm/min), which is lower than the rapid traverse rate, and as a contact between the wire electrode and the workpiece is detected, the motion of the workpiece is stopped and the contact position at that time is acquired.

SUMMARY OF THE INVENTION

Since in U.S. Pat. No. 4,027,834 the rapid traverse is affected at a speed of 4 to 8 m/min, the wire electrode rushes into the workpiece even if rapid traverse of the workpiece is stopped right after detection of a contact, which causes a risk of the wire electrode being broken. By setting a small time constant, it is possible to prevent the wire electrode from being broken. However, since the speed sharply changes during deceleration, impacts on the mechanical system of the wire electrical discharge machine become greater.

On the other hand, when the wire electrode and the workpiece are moved relative to each other in the cutting feed mode with a low feed speed to acquire the contact position, there is no risk of the wire electrode being broken. However, it takes time to perform relative motion, so that a longer time is needed for positioning.

It is therefore an object of the present invention to provide a wire electrical discharge machine and a measuring method which, in positioning the wire electrode or in measuring the shape of the object by detecting contact between the wire electrode and the workpiece while moving them relatively to each other, can shorten the time required for the relative motion of a wire electrode and a measurement target while still preventing breakage of the wire electrode and can suppress mechanical impacts due to acceleration and deceleration during the relative motion.

According to one aspect of the first mode of the present invention, a wire electrical discharge machine for positioning a wire electrode supported by upper and lower guides or measuring the shape of a measurement target, by moving the wire electrode and the measurement target relatively to each other to detect contact, includes: a driver configured to relatively move the wire electrode to the measurement target; servomotors configured to move the driver; a setting changer configured to change the setting of a directive speed; and a motor controller configured to control the servomotors in performing move-and-contact detection for detecting contact between the wire electrode and the measurement target by relatively moving the two relative to each other, so that the wire electrode is moved relative to the measurement target based on the directive speed changed and specified by the setting changer.

In this way, since the setting of the directive speed for move-and-contact detection can be arbitrarily changed, the wire electrode can be relatively moved at the optimum speed and acceleration in performing move-and-contact detection. Accordingly, it is possible to shorten the time required for the relative motion of the wire electrode in performing move-and-contact detection, prevent the wire electrode from being broken and suppress impacts on the mechanical system due to acceleration/deceleration during the relative motion.

One aspect of the first mode of the present invention may reside in the above-described wire electrical discharge machine, which further includes a contact detector configured to detect contact between the wire electrode and the measurement target, wherein the setting changer is configured to change the setting of a time constant; and the motor controller is configured to control the servomotors in performing move-and-contact detection so that the relative motion speed of wire electrode to the measurement target comes to the directive speed with the time constant to thereby relatively move the wire electrode to the measurement target, and control the servomotors so that the wire electrode moving at the directive speed relative to the measurement target stops with the time contact when contact between the wire electrode and the measurement target is detected by the contact detector.

In this way, in addition to the directive speed for move-and-contact detection, the setting of the time constant can be arbitrarily changed, so that it is possible to relatively move the wire electrode at a more preferable speed and acceleration in performing move-and-contact detection. Accordingly, it is possible to shorten the time required for the relative motion of the wire electrode in performing move-and-contact detection, prevent the wire electrode from being broken and further suppress impacts on the mechanical system due to acceleration/deceleration during the relative motion.

One aspect of the first mode of the present invention may reside in the above-described wire electrical discharge machine in which the motor controller is configured to control the servomotors so that the relative motion speed of the wire electrode to the measurement target varies with acceleration or deceleration of a bell-shaped curve until the time constant elapses. This further contributes to improved suppression of impacts on the mechanical system due to acceleration/deceleration during the relative motion.

One aspect of the first mode of the present invention may reside in the above-described wire electrical discharge machine, which further includes a load torque estimator configured to estimate load torque of the servomotors, and a threshold setter configured to set a threshold of the load torque, wherein the setting changer is configured to change the setting of a directive acceleration in performing move-and-contact detection so as to vary the directive speed with the passage of time based on the directive acceleration until the load torque estimated by the load torque estimator exceeds the threshold and fix the directive speed when the load torque exceeds the threshold so that the wire electrode is moved at a constant speed relative to the measurement target.

In this way, the directive acceleration and the threshold value in performing move-and-contact detection can be arbitrarily selected, so that it is possible to relatively move the wire electrode at the optimal speed and acceleration in performing move-and-contact detection. Accordingly, it is possible to shorten the time required for the relative motion of the wire electrode in performing move-and-contact detection, prevent the wire electrode from being broken, and further suppress impacts on the mechanical system due to acceleration/deceleration during the relative motion.

One aspect of the first mode of the present invention may reside in the above-described wire electrical discharge machine, which further includes a contact detector configured to detect contact between the wire electrode and the measurement target, wherein the motor controller is configured to control the servomotors so as to stop the relative motion of the wire electrode to the measurement target when contact between the wire electrode and the measurement target is detected by the contact detector. Thereby, it is possible to prevent the wire electrode from being broken.

According to one aspect of the second mode of the present invention, a measuring method for use in a wire electrical discharge machine that includes: a driver configured to relatively move a wire electrode supported by upper and lower guides relative to a measurement target; servomotors configured to move the driver; and a contact detector configured to detect contact between the wire electrode and the measurement target, to position the wire electrode or measure the shape of the measurement target, by moving the wire electrode and the measurement target relatively to each other to detect contact, includes: a setting change step of changing the setting of a directive speed; and a motor control step of controlling the servomotors, in performing move-and-contact detection for detecting contact between the wire electrode and the measurement target by relatively moving the two relative to each other, so that the wire electrode is moved relative to the measurement target based on the directive speed changed and specified by the setting changer.

In this way, since the setting of the directive speed for move-and-contact detection can be arbitrarily changed, the wire electrode can be relatively moved at the optimum speed and acceleration in performing move-and-contact detection. Accordingly, it is possible to shorten the time required for the relative motion of the wire electrode in performing move-and-contact detection, prevent the wire electrode from being broken and suppress impacts on the mechanical system due to acceleration/deceleration during the relative motion.

One aspect of the second mode of the present invention may reside in the above-described measuring method in which the setting change step is to additionally change the setting of a time constant, and the motor control step is to control the servomotors in performing move-and-contact detection so that the relative motion speed of wire electrode to the measurement target comes to the directive speed with the time constant to thereby relatively move the wire electrode to the measurement target, and control the servomotors so that the wire electrode moving at the directive speed relative to the measurement target stops with the time contact when contact between the wire electrode and the measurement target is detected by the contact detector.

In this way, in addition to the directive speed for move-and-contact detection, the setting of the time constant can be arbitrarily changed, so that it is possible to relatively move the wire electrode at a more preferable speed and acceleration in performing move-and-contact detection. Accordingly, it is possible to shorten the time required for the relative motion of the wire electrode in performing move-and-contact detection, prevent the wire electrode from being broken and further suppress impacts on the mechanical system due to acceleration/deceleration during the relative motion.

One aspect of the second mode of the present invention may reside in the above-described measuring method in which the motor control step is to control the servomotors so that the relative motion speed of the wire electrode to the measurement target varies with acceleration or deceleration of a bell-shaped curve until the time constant elapses. This further contributes to improved suppression of impacts on the mechanical system due to acceleration/deceleration during the relative motion.

One aspect of the second mode of the present invention may reside in the above-described measuring method, which further includes a load torque estimation step of estimating load torque of the servomotors, and a threshold setting step of setting a threshold of the load torque, wherein the setting change step is to change the setting of a directive acceleration in performing move-and-contact detection so as to vary the directive speed with the passage of time based on the directive acceleration until the load torque estimated by the load torque estimation step exceeds the threshold and fix the directive speed when the load torque exceeds the threshold so that the wire electrode is moved at a constant speed relative to the measurement target.

In this way, the directive acceleration and the threshold value in performing move-and-contact detection can be arbitrarily selected, so that it is possible to relatively move the wire electrode at the optimal speed and acceleration in performing move-and-contact detection. Accordingly, it is possible to shorten the time required for the relative motion of the wire electrode in performing move-and-contact detection, prevent the wire electrode from being broken, and further suppress impacts on the mechanical system due to acceleration/deceleration during the relative motion.

One aspect of the second mode of the present invention may reside in the above-described measuring method in which the motor control step is to control the servomotors so as to stop the relative motion of the wire electrode to the measurement target when contact between the wire electrode and the measurement target is detected by the contact detector. Thereby, it is possible to prevent the wire electrode from being broken.

According to the present invention, it is possible to relatively move the wire electrode at the optimal speed and acceleration in performing move-and-contact detection. It is hence possible to shorten the time required for the relative motion of the wire electrode in performing move-and-contact detection, prevent the wire electrode from being broken, and further suppress impacts on the mechanical system due to acceleration/deceleration during the relative motion.

The above and other objects features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 6 is a flowchart showing the operation of a control device shown in FIG. 1;

FIG. 7A is a time chart showing the relative motion speed of a wire electrode to a workpiece, and FIG. 7B is a time chart showing the relative motion acceleration of the wire electrode to the workpiece;

DESCRIPTION OF THE PREFERRED EMBODIMENTS

Referring next to the accompanying drawings, the wire electrical discharge machine and measuring method according to the present invention will be described in detail hereinbelow by providing preferred embodiments.

Embodiment 1

Figure 1:
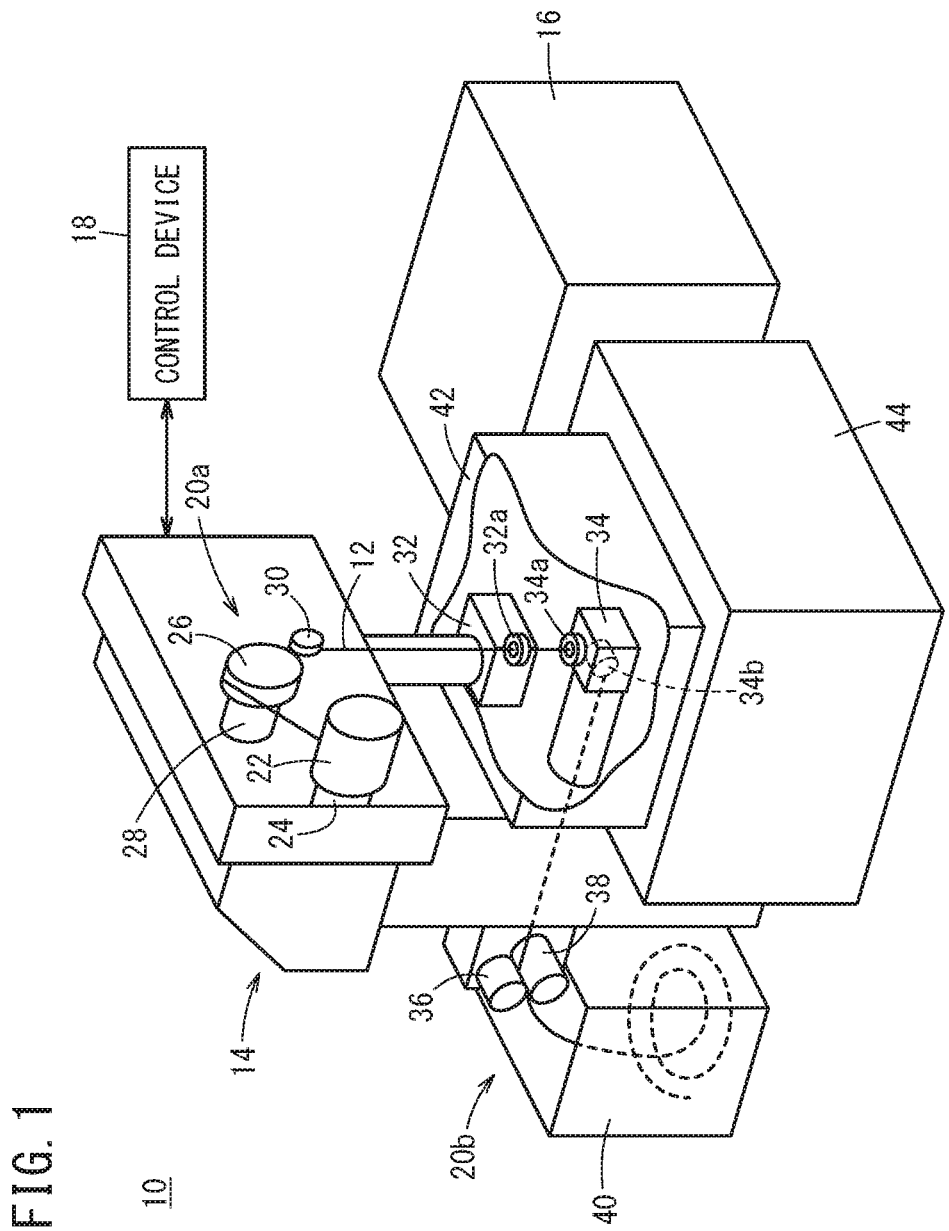
FIG. 1 is a schematic mechanical configuration diagram of a wire electrical discharge machine.

FIG. 1 is a schematic mechanical configuration diagram of a wire electrical discharge machine 10. The wire electrical discharge machine 10 is a machine tool that performs electrical discharge machining on an object to be processed (workpiece or measurement target) W, by applying voltage across an electrode gap (clearance) formed between a wire electrode 12 and the workpiece W (see FIG. 2) to generate electric discharge in a dielectric working fluid. The wire electrical discharge machine 10 includes a main machine body 14, a working fluid processor 16 and a control device 18.

The wire electrode 12 is formed of, for example, metal material such as tungsten-based, copper-alloy based and brass-based material. On the other hand, the material of the workpiece W is, for example, iron-based material or tungsten carbide material.

The main machine body 14 includes a supply system 20a for supplying the wire electrode 12 toward the workpiece W and a collection system 20b for collecting the wire electrode 12 having passed through the workpiece W.

The supply system 20a includes a wire bobbin 22 with the wire electrode 12 wound thereon, a torque motor 24 for applying a torque to the wire bobbin 22, a brake shoe 26 for applying a braking force by friction to the wire electrode 12, a braking motor 28 for applying a braking torque to the brake shoe 26, a tension detector 30 for detecting the tension of the wire electrode 12 and a wire guide (upper wire guide) 32 for guiding the wire electrode 12 above the workpiece W.

The collection system 20b includes a wire guide (lower wire guide) 34 for guiding the wire electrode 12 below the workpiece W, a pinch roller 36 and feed roller 38 capable of gripping the wire electrode 12 and a wire collection box 40 for collecting the wire electrode 12 conveyed by the pinch roller 36 and feed roller 38.

The main machine body 14 includes a work-pan 42 capable of storing a dielectric working fluid of deionized water or oil used in electrical discharge machining with the upper wire guide 32 and the lower wire guide 34 arranged in the work-pan 42. The work-pan 42 is mounted on a base 44. The workpiece W is placed between the upper wire guide 32 and the lower wire guide 34. The upper wire guide 32 and the lower wire guide 34 respectively have die guides 32a and 34a for supporting the wire electrode 12. The lower wire guide 34 includes a guide roller 34b that guides the wire electrode 12 to the pinch roller 36 and the feed roller 38 by deflecting the travel of the wire electrode 12.

The upper wire guide 32 ejects a clean working fluid not containing sludge (machined swarf). This function makes it possible to fill the clearance (electrode gap) between the wire electrode 12 and the workpiece W with a clean working fluid suitable for electrical discharge machining, and also prevent the accuracy of electrical discharge machining from being deteriorated by sludge arising during electrical discharge machining. Also, the lower wire guide 34 may also jet a clean working liquid not containing sludge.

Figure 2:
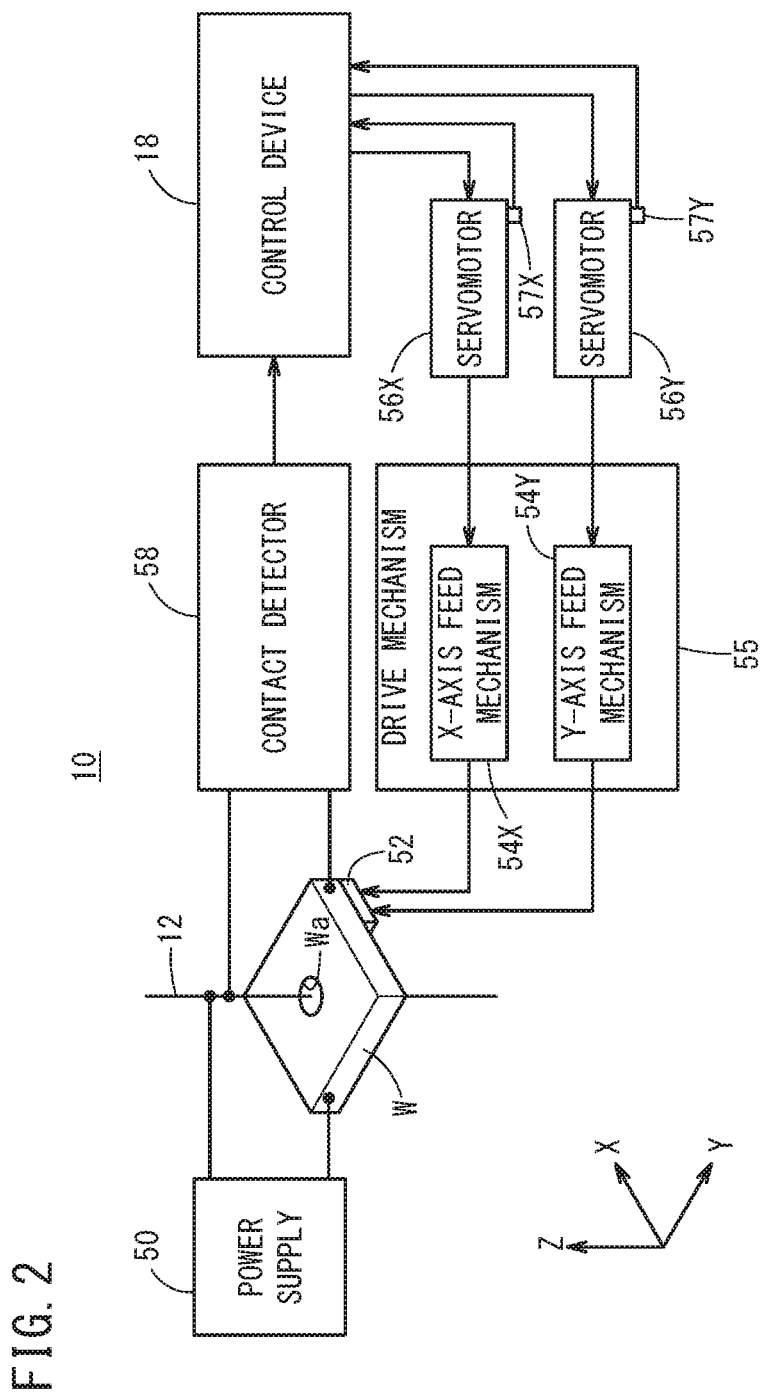
FIG. 2 is a schematic electrical block diagram of the wire electrical discharge machine according to the first embodiment.

The workpiece W is supported by a supporting member 52 of a table etc., and the supporting member 52 is arranged inside the work-pan 42 (see FIG. 2). The wire guides 32 and 34, the supporting member 52 and the workpiece W are immersed in the dielectric working fluid stored in the work-pan 42.

While moving the position of the supporting member 52 and the position of the wire electrode 12 supported by the wire guides 32, 34 relatively to each other, the main machine body 14 (wire electrical discharge machine 10) machines the workpiece W. In the first embodiment, the supporting member 52 is moved in the X-direction and the Y-direction so as to produce relative motion between the wire electrode 12 and the workpiece W. Note that the X-direction and the Y-direction are orthogonal to each other, and the direction orthogonal to the XY-plane is defined as the Z-direction.

The dielectric working fluid processor 16 is a device that removes machined swarf (sludge) produced in the work-pan 42 and manages the quality of the dielectric working fluid by adjusting the electric resistivity and temperature and the like. The dielectric working fluid that has been adjusted in quality by this working fluid processor 16 is returned to the work-pan 42 again. The control device 18 controls the main machine body 14 and the working fluid processor 16.

FIG. 2 is a schematic electrical configuration diagram of the wire electrical discharge machine 10. The wire electrical discharge machine 10 further includes a power supply 50, a supporting member 52, an X-axis feed mechanism 54X, a Y-axis feed mechanism 54Y, servomotors 56X, 56Y, and a contact detector 58. The power supply 50 is a power source for applying voltage across an electrode gap formed between the wire electrode 12 and the workpiece (measurement target) W. The power supply 50 applies voltage across the electrode gap under the control of the control device 18. The power supply 50 can apply a voltage for measurement to the electrode gap in positioning the wire electrode 12 relative to the workpiece W or in measuring the shape of the workpiece W, and apply a voltage for electrical discharge machining other than the voltage for measurement to the electrode gap in the case of electrical discharge machining.

The supporting member 52 is a drive part (for example, a table) for moving the workpiece W on a plane parallel to the XY-plane while supporting the workpiece W. This workpiece W is formed with a start hole Wa from which electrical discharge machining is started and the wire electrode 12 is inserted through the start hole Wa and connected. After the wire electrode 12 is passed through the start hole Wa and connected, the workpiece W can be machined by moving the supporting member 52 (workpiece W) on the plane parallel to the XY-plane. Connection of the wire electrode 12 means that the wire electrode 12 wound on the wire bobbin 22 is passed through the wire guide 32, the workpiece W and the wire guide 34 and held between the pinch roller 36 and the feed roller 38. As the wire electrode 12 is connected, the wire electrode 12 is stretched with a predetermined tension. It should be noted that the aftermentioned positioning of the wire electrode 12 is performed after the connection up to the start of the machining.

The X-axis feed mechanism 54X is a mechanism for moving the supporting member 52 (the workpiece W) in the X-direction. The servomotor 56X is a motor for moving the supporting member 52 in the X-direction and drives the X-axis feed mechanism 54X. The X-axis feed mechanism 54X converts the rotational force of the servomotor 56X into linear motion to thereby move the supporting member 52 in the X-direction.

The Y-axis feed mechanism 54Y is a mechanism for moving the supporting member 52 (workpiece W) in the Y-direction. The servomotor 56Y is a motor for moving the supporting member 52 in the Y-direction, and drives the Y-axis feed mechanism 54Y. The Y-axis feed mechanism 54Y converts the rotational force of the servomotor 56Y into linear motion to thereby move the supporting member 52 in the Y-direction.

The X-axis feed mechanism 54X and the Y-axis feed mechanism 54Y constitute a drive mechanism 55 for moving the supporting member 52 (workpiece W). By moving the supporting member 52 in the X-direction and the Y-direction, the wire electrode 12 and the workpiece W can be moved relative to each other.

The servomotors 56X, 56Y are driven under the control of the control device 18. Herein, the servomotors 56X, 56Y respectively have encoders 57X, 57Y for detecting the rotational positions of the servomotors 56X, 56Y. Based on this rotational position, the rotational speed of the servomotors 56X, 56Y can also be specified. Detection signals detected by the encoders 57X, 57Y are sent to the control device 18.

The contact detector 58 detects the voltage applied across the electrode gap (hereinafter, gap voltage) to thereby determine whether or not the wire electrode 12 comes into contact with the workpiece W (the inner wall of the start hole Wa). When the wire electrode 12 touches the workpiece (measurement target) W, electric current flows so that the gap voltage lowers. Therefore, the contact detector 58 can detect whether or not the wire electrode 12 and the workpiece W have come into contact, based on the change of the detected gap voltage. The detection result of the contact detector 58 is sent to the control device 18.

Figure 3:
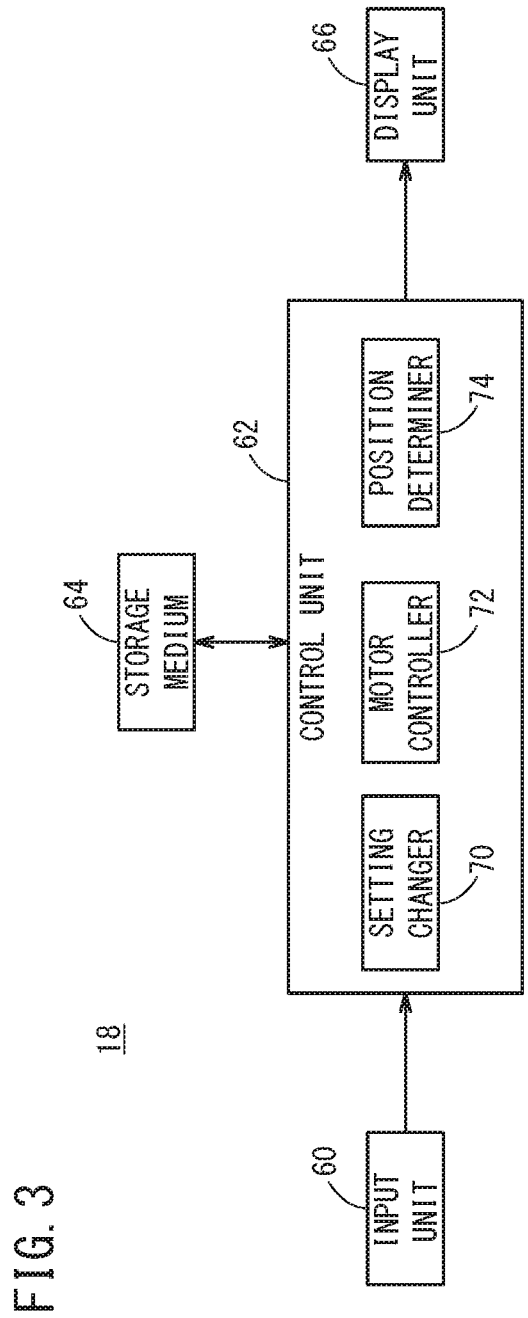
FIG. 3 is a block diagram showing a configuration of a control device shown in FIG. 1.

Referring next to FIG. 3, the configuration of the control device 18 will be briefly described. The control device 18 includes an input unit 60, a control unit 62, a storage medium 64 and a display unit 66. The input unit 60 is an operation unit operated by an operator to input information, instructions and others. The input unit 60 includes ten keys for inputting numeric data, various function keys (e.g., a power button, etc.), a keyboard, a touch panel and the like. The control unit 62 includes a processor such as a CPU and a memory chip storing a program. This processor, when running this program, provides the function of the control unit 62 of the first embodiment.

The storage medium 64 stores data and the like necessary for control by the control unit 62 and also functions as a buffer memory. The display unit 66 is constituted of a liquid crystal display, organic EL display or the like, and displays necessary information and others. The touch panel of the input unit 60 is provided over the display screen of the display unit 66. Here, the input unit 60 and the display unit 66 may be integrally formed.

The control unit 62 includes a setting changer 70, a motor controller 72 and a position determiner 74. The setting changer 70 changes the values of a directive speed Vc and a time constant τ. The setting changer 70 changes the setting of the directive speed Vc and the time constant τ for move-and-contact detection in which contact between the wire electrode 12 and the workpiece W is detected by relatively moving the two components. The setting changer 70 may set the speed and time input by the user's operation of the input unit 60 as the directive speed Vc and the time constant τ, or may set the directive speed Vc and the time constant τ in accordance with a predetermined program (for example, a program for move-and-contact detection).

The directive speed Vc specifies the moving speed V of the supporting member 52 (the workpiece W) (that is, the relative motion speed of the wire electrode 12 relative to the workpiece W), and the supporting member 52 (the workpiece W) is controlled to move at the directive speed Vc. The time constant τ indicates the time (delay time) required for the supporting member 52 (the workpiece W), initially at rest, to move at the directive speed Vc, and the time (delay time) required for the supporting member 52 (the workpiece W), initially moving at the directive speed Vc to come to stop. In other words, the time constant τ is the delay time required to achieve the target speed.

In performing move-and-contact detection, the motor controller 72 controls the servomotors 56X, 56Y so that the moving speed V of the supporting member 52 (the workpiece W) becomes the directive speed Vc in the time constant τ changed by the setting changer 70. In the first embodiment, the motor controller 72 moves the supporting member 52 in the X-direction first in order to detect the contact position of the wire electrode 12 against the workpiece W with respect to the X-direction. Then, in order to detect the contact position of the wire electrode 12 against the workpiece W with respect to the Y-direction, the motor controller 72 moves the supporting member 52 in the Y-direction. Accordingly, in performing move-and-contact detection in the X-direction, the motor controller 72 controls the servomotor 56X so that the moving speed V of the supporting member 52 (workpiece W) in the X-direction will come to the directive speed Vc in the time constant τ set by the setting changer 70. Similarly, in performing move-and-contact detection in the Y-direction, the motor controller 72 controls the servomotor 56Y so that the moving speed V of the supporting member 52 (workpiece W) in the Y-direction will come to the directive speed Vc in the time constant τ set by the setting changer 70.

More specifically, the motor controller 72, as moving the supporting member 52 in the positive X-direction, detects contact between the wire electrode 12 and the workpiece W (the inner wall of the start hole Wa) by the contact detector 58, then stops motion of the supporting member 52 in the positive X-direction. Next, the motor controller 72, as moving the supporting member 52 in the negative X-direction, detects contact between the wire electrode 12 and the workpiece W (the inner wall of the start hole Wa) by the contact detector 58, then stops motion of the supporting member 52 in the negative X-direction. Further, the motor controller 72, as moving the supporting member 52 in the positive Y-direction, detects contact between the wire electrode 12 and the workpiece W (the inner wall of the start hole Wa) by the contact detector 58, then stops motion of the supporting member 52 in the positive Y-direction. Subsequently, the motor controller 72, as moving the supporting member 52 in the negative Y-direction, detects contact between the wire electrode 12 and the workpiece W (the inner wall of the start hole Wa) by the contact detector 58, then stops motion of the supporting member 52 in the negative Y-direction.

Motion of the supporting member 52 in the positive X-direction produces relative motion of the wire electrode 12 in the negative X-direction relative to the workpiece W, whereas motion of the supporting member 52 in the negative X-direction produces relative motion of the wire electrode 12 in the positive X-direction relative to the workpiece W. Similarly, motion of the supporting member 52 in the positive Y-direction produces relative motion of the wire electrode 12 in the negative Y-direction relative to the workpiece W, whereas motion of the supporting member 52 in the negative Y-direction produces relative motion of the wire electrode 12 in the positive Y-direction relative to the workpiece W.

Here, the motor controller 72 preforms control (feedback control) of the servomotors 56X, 56Y by using the detection signals detected by the encoders 57X, 57Y.

The position determiner 74 stores in the storage medium 64 the contact positions between the wire electrode 12 and the inner wall on the positive and negative X-direction sides of the start hole Wa and the contact positions between the wire electrode 12 and the inner wall on the positive and negative Y-direction sides of the start hole Wa. The position determiner 74 may determine the contact positions based on the detection signals of the encoders 57X, 57Y when the wire electrode 12 and the start hole Wa contact, or may determine the contact positions based on the detection result of a position sensor that detects the positions of the supporting member 52 with respect to the X-direction and the Y-direction.

The position determiner 74 determines the position of the wire electrode 12 based on the multiple contact positions stored in the storage medium 64. For example, the position determiner 74 calculates the center position of the start hole Wa based on the multiple contact positions to determine the center position as the position of the wire electrode 12. The position determiner 74 outputs the determined position of the wire electrode 12 to the motor controller 72.

The motor controller 72 moves the supporting member 52 so that the wire electrode 12 is placed at the aforementioned position determined by the position determiner 74. Thus, the wire electrode 12 is positioned with respect to the workpiece W.

Here, there are two modes for moving the wire electrode 12, namely, "cutting feed" and "rapid traverse". This "cutting feed" is to move the wire electrode 12 relative to the workpiece W during electrical discharge machining. On the other hand, the "rapid traverse" mode moves the wire electrode 12 relative to the workpiece W in order to position the wire electrode 12 while the electrical discharge machining is not performed.

Figure 4:
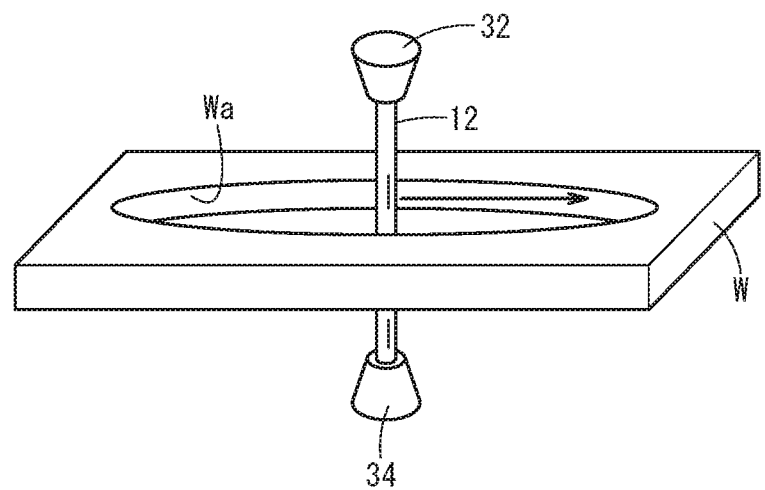
FIG. 4 is a diagram showing relative motion of a wire electrode to a workpiece.

In the case of "cutting feed", since it is performed during electrical discharge machining, the feed speed (relative motion speed) V of the wire electrode 12 is generally set within a relatively slow range of 1 to 50 mm/min. Suppose, for example, that the diameter of the start hole Wa is about ϕ 200 mm, the relative move speed V of the wire electrode 12 is about 50 mm/min, the distance from the position of the wire electrode 12 to the inner wall of the start hole Wa on the wire electrode 12's approaching side is about 100 mm. In this case, as shown in FIG. 4, it takes about two minutes for the wire electrode 12 to reach and contact the inner wall of the start hole Wa from the start of relative motion to the workpiece W in performing move-and-contact detection. Therefore, in the case of "cutting feed", a too long time is required for the wire electrode 12 to reach and contact the inner wall of the start hole Wa of the workpiece W (the time required for relative motion of the wire electrode 12).

On the other hand, since "rapid traverse" is performed except for electrical discharge machining, the feed speed (relative move speed) V of the wire electrode 12 is generally set within a range of 900 to 2000 mm/min. It is assumed, for example, that the diameter of the start hole Wa is set to about ϕ 200 mm, the relative motion speed V of the wire electrode 12 is set to about 2000 mm/min, the distance from the position of the wire electrode 12 to the inner wall of the start hole Wa on the wire electrode 12's approaching side is about 100 mm. In this case, it takes about 0.05 minutes for the wire electrode 12 to reach and contact the inner wall of the start hole Wa from the start of relative motion to the workpiece W for move-and-contact detection. In this way, in the case of "rapid traverse", since the feed speed is much faster than that of "cutting feed", the time required for the wire electrode 12 to reach and contact the inner wall of the start hole Wa of the workpiece W (the time required for relative motion) can be shortened.

Figure 5:
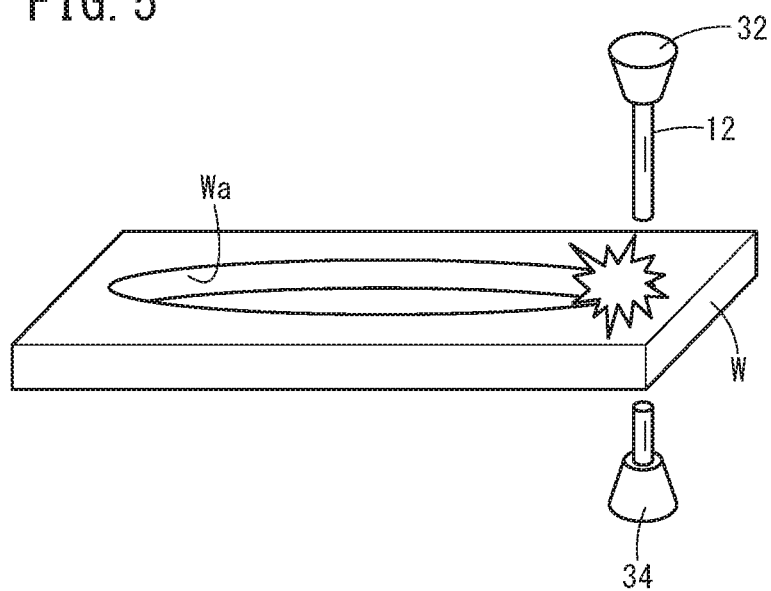
FIG. 5 is a diagram showing breakage of a wire electrode caused by a delay in stopping relative motion of a wire electrode to a workpiece.

When the contact between the wire electrode 12 and the start hole Wa is detected, the motor controller 72 controls the servomotors 56X, 56Y so that the relative motion of the wire electrode 12 to the workpiece W is stopped. If the feed speed is high, the stopping distance (the distance from the point at which deceleration starts to the stopping point) for stopping the relative motion of the wire electrode 12 becomes longer, so that the wire electrode 12 would break as shown in FIG. 5.

Therefore, it is difficult to move the wire electrode 12 in "rapid traverse" in performing move-and-contact detection, but if the time constant is set short, the stopping distance for stopping the relative motion of the wire electrode 12 becomes short so that the wire electrode 12 can be prevented from being broken. However, since the relative motion speed of the wire electrode 12 relative to the workpiece W sharply slows down, the impacts on the mechanical system (for example, the drive mechanism 55 and the servomotors 56X, 56Y) for moving the supporting member 52 becomes too large.

Therefore, in the first embodiment, the relative motion speed (the moving speed of the supporting member 52) V of the wire electrode 12 relative to the workpiece W and the time constant τ for move-and-contact detection is made variable to solve the problem.

FIG. 6 is a flowchart showing the operation of the control device 18 (control unit 62) according to the first embodiment. FIG. 7A is a time chart showing the relative motion speed (the moving speed of the supporting member 52) V of the wire electrode 12 relative to the workpiece W, and FIG. 7B is a time chart showing the relative acceleration of the wire electrode 12 (the moving acceleration of the supporting member 52) relative to the workpiece W. In the operation shown in the flowchart of FIG. 6, description will be made by giving an example where the wire electrode 12 is moved in the X-direction relative to the workpiece W.

At step S1, the setting changer 70 changes the settings of the directive speed Vc and the time constant τ for move-and-contact detection. The setting changer 70 may change the settings of the directive speed Vc and the time constant τ based on the operation through the input unit 60 by the operator, or may change the settings of the directive speed Vc and the time constant τ based on a predetermined program (for example, a program for performing move-and-contact detection). The directive speed Vc and the time constant τ are set to appropriate values depending on the diameter and shape of the start hole Wa.

Next, at step S2 the motor controller 72 controls the servomotor 56X based on the directive speed Vc and the time constant τ changed and set at step S1 so as to start relative motion of the wire electrode 12 in the X-direction in performing move-and-contact detection. Specifically, the supporting member 52 (the workpiece W) as a driver is moved in the X-direction to thereby relatively move the wire electrode 12. The motor controller 72 controls the servomotor 56X so that the relative motion speed V of the wire electrode 12 to the workpiece W comes to be equal to the directive speed Vc in the time constant τ set at step S1 (see FIG. 7A). At this time, the motor controller 72 controls the servomotor 56X so that the relative motion speed V of the wire electrode 12 varies with acceleration or deceleration of a bell-shaped curve until the time constant τ elapses (see FIG. 7B).

Subsequently, at step S3 the motor controller 72 determines whether or not the contact detector 58 detects contact between the wire electrode 12 and the workpiece W (the inner wall of the start hole Wa). If it is determined at step S3 that contact has not been detected, the control stays at step S3.

On the other hand, if it is determined at step S3 that contact has been detected, the control goes to step S4, where the motor controller 72 stops the relative motion of the wire electrode 12. The motor controller 72 controls the servomotor 56X so that the wire electrode 12 moving relative to the workpiece W at the directive speed Vc stops in the time constant τ (the relative motion speed V becomes zero) (See FIG. 7A). At this time, the motor controller 72 controls the servomotor 56X so that the relative motion speed V of the wire electrode 12 varies with acceleration or deceleration of a bell-shaped curve until the time constant τ elapses (see FIG. 7B). Thereafter, the control device 18 starts a next sequence required for positioning the wire electrode 12.

In the above operation, by setting the directive speed Vc at 900 mm/min and the time constant τ at about 50 msec, it is possible to reduce the moving distance up to actual stop to about 1 mm from when the servo motor 56X is controlled to stop the relative movement of the wire electrode 12. Accordingly, the time for relative motion of the wire electrode 12 in performing move-and-contact detection can be shortened, the wire electrode 12 can be prevented from being broken and the impacts of the mechanical system can be also alleviated.

Embodiment 2

Figure 8:
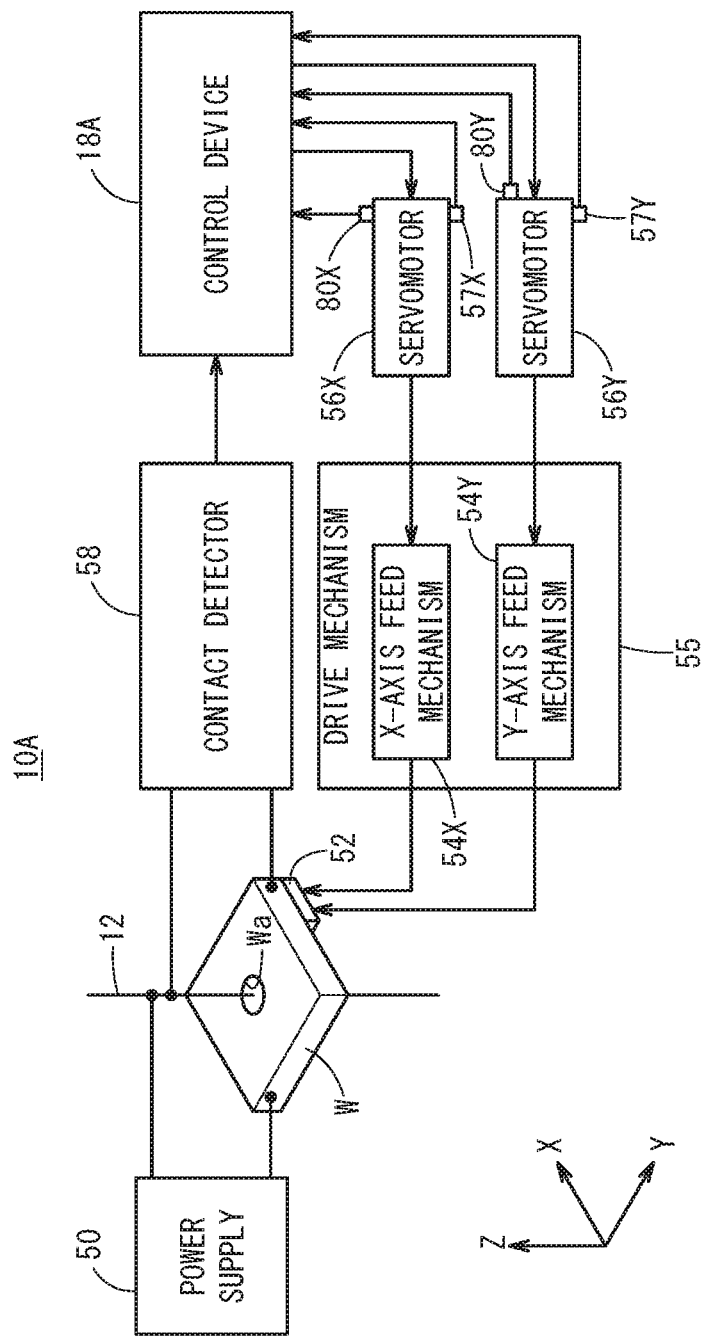
FIG. 8 is a schematic electrical configuration diagram of a wire electrical discharge machine according to the second embodiment.

Next, a wire electrical discharge machine 10A according to the second embodiment will be described. FIG. 8 is a schematic electrical configuration diagram of the wire electrical discharge machine 10A according to the second embodiment. The same reference numerals are allotted to the same components as those of the first embodiment, and only different components will be described.

The wire electrical discharge machine 10A includes a wire electrode 12, a control device 18A, a power supply 50, a supporting member 52, an X-axis feed mechanism 54X, a Y-axis feed mechanism 54Y, servomotors 56X, 56Y, encoders 57X, 57Y, and a contact detector 58. The wire electrical discharge machine 10A further includes current sensors 80X and 80Y that detect excitation currents flowing through the servomotors 56X, 56Y. Detection signals of the current sensors 80X and 80Y are sent to the control device 18A.

Figure 9:
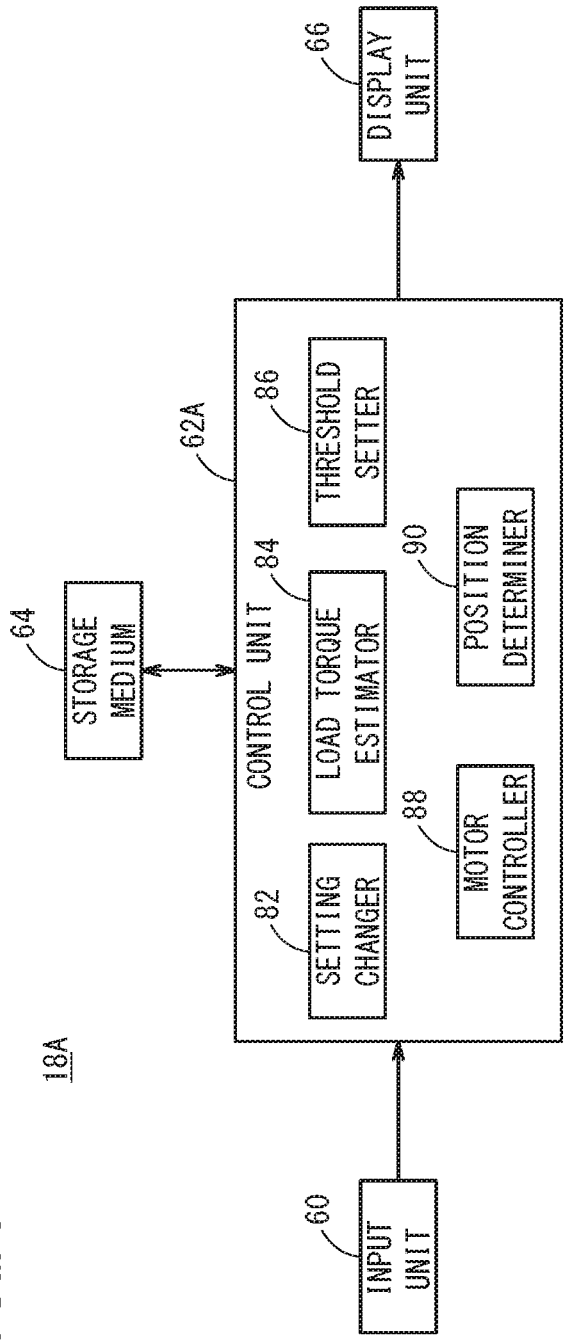
FIG. 9 is a diagram showing the configuration of a control device shown in FIG. 8; and, FIG. 10 is a flowchart showing the operation of the control device shown in FIG. 9.

FIG. 9 is a diagram showing a configuration of the control device 18A. The control device 18A includes an input unit 60, a control unit 62A, a storage medium 64 and a display unit 66. The control unit 62A includes a setting changer 82, a load torque estimator 84, a threshold setter 86, a motor controller 88 and a position determiner 90.

The setting changer 82 changes the setting of the directive acceleration Ac in performing move-and-contact detection. The setting changer 82 may use an acceleration value input through the input unit 60 by the operator as the directive acceleration Ac or may change the directive acceleration Ac based on a predetermined program (for example, a program for performing the move-and-contact detection). The setting changer 82 changes the directive speed Vc with the passage of time based on the changed directive acceleration Ac. That is, the directive speed Vc is varied so that the directive speed Vc is accelerated at the directive acceleration Ac.

The load torque estimator 84 estimates the load torque of the servomotors 56X, 56Y in performing move-and-contact detection. The load torque estimator 84 estimates the load torque TL of the servomotors 56X, 56Y based on the current values detected by the current sensors 80X and 80Y. Estimation of the load torque TL may be performed using a known technique.

The threshold setter 86 sets a threshold Th of the load torque TL of the servomotors 56X, 56Y in performing move-and-contact detection. The threshold setter 86 may set a value input through the input unit 60 by the operator as the threshold value Th or may set the threshold value Th based on a predetermined program (for example, a program for performing move-and-contact detection).

The motor controller 88 controls the servomotors 56X, 56Y so that the supporting member 52 moves at the directive speed Vc changed by the setting changer 82 in performing move-and-contact detection. Since the directive speed Vc is changing with time based on the directive acceleration Ac, the motor controller 88 controls the servomotors 56X, 56Y so that the moving speed V of the supporting member 52 (the workpiece W) accelerates at the directive acceleration Ac that has been changed by the setting changer 82. When moving the supporting member 52 in the X-direction (positive/negative X-direction) in performing move-and-contact detection, the motor controller 88 controls the servomotor 56X so that the supporting member 52 accelerates at the directive acceleration Ac set by the setting changer 82. When moving the supporting member 52 in the Y-direction (positive/negative Y-direction) in performing move-and-contact detection, the motor controller 88 controls the servomotor 56Y so that the supporting member 52 accelerates at the directive acceleration Ac set by the setting changer 82.

The setting changer 82 changes the directive speed Vc with time based on the directive acceleration Ac until the load torque TL estimated by the load torque estimator 84 exceeds the threshold Th. When the load torque TL exceeds the threshold Th, the setting changer 82 stops changing the directive speed Vc and fixes the directive speed Vc so that the supporting member 52 moves at a uniform speed. Accordingly, until the load torque TL estimated by the load torque estimator 84 exceeds the threshold value Th, the motor controller 88 controls the servomotors 56X, 56Y so that the supporting member 52 accelerates at the directive acceleration Ac set and changed by the setting changer 82. When the load torque TL estimated by the load torque estimator 84 exceeds the threshold value Th, the motor controller 88 controls the servomotors 56X, 56Y so that the supporting member 52 moves at the moving speed V of the supporting member 52 at that time.

The position determiner 90 stores the contact positions between the wire electrode 12 and the inner wall on the positive and negative X-direction sides of the start hole Wa and the contact positions between the wire electrode 12 and the inner wall on the positive and negative Y-direction sides of the start hole Wa into the storage medium 64. The position determiner 90 may determine the contact positions based on the detection signals of the encoders 57X, 57Y when the wire electrode 12 and the start hole Wa contact, or may determine the positions based on the detection result of a position sensor that detects the contact positions of the supporting member 52 with respect to the X-direction and the Y-direction.

The position determiner 90 determines the position of the wire electrode 12 based on the multiple contact positions stored in the storage medium 64. For example, the position determiner 90 calculates the center position of the start hole Wa based on the multiple contact positions to determine the center position as the position of the wire electrode 12. The position determiner 90 outputs the determined position of the wire electrode 12 to the motor controller 88. The position determiner 90 is similar to the position determiner 74 of the first embodiment.

The motor controller 88 moves the supporting member 52 so that the wire electrode 12 is placed at the aforementioned position determined by the position determiner 90. Thus, the wire electrode 12 is positioned with respect to the workpiece W.

Figure 10:
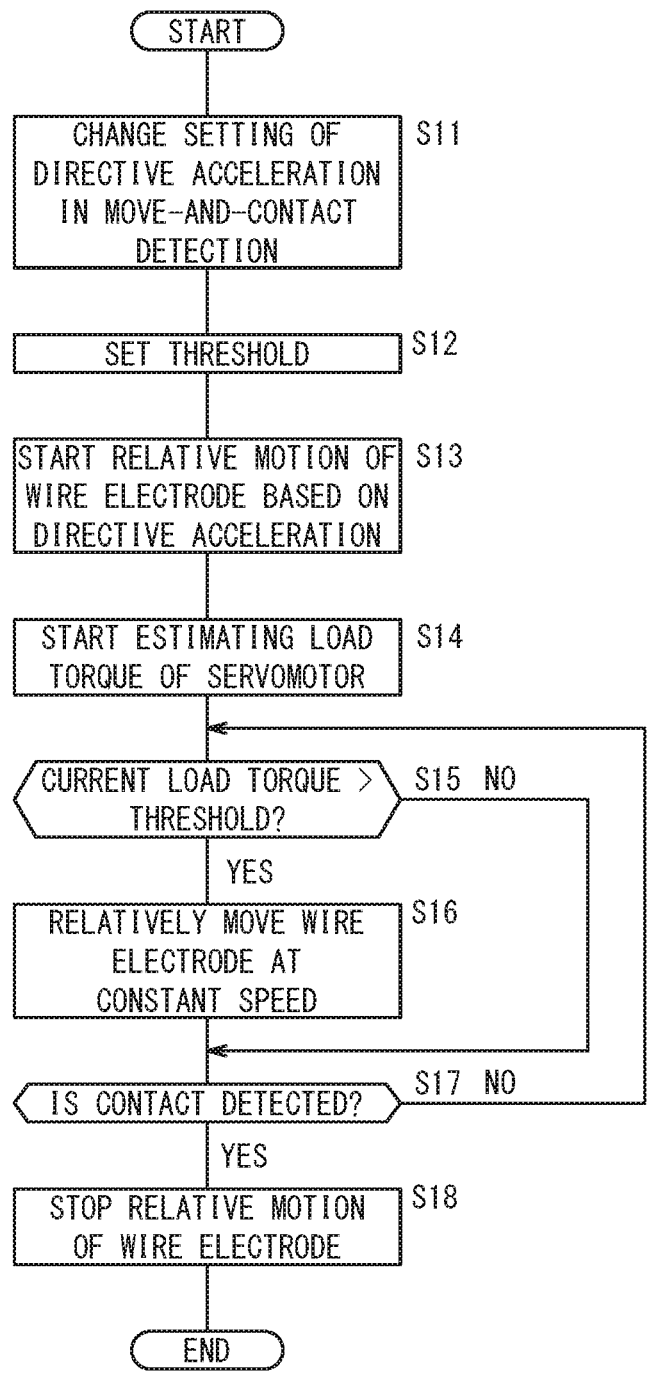

FIG. 10 is a flowchart showing the operation of the control device 18A (control unit 62A) according to the second embodiment. In the operation shown in the flowchart of FIG. 10, description will be made by giving an example where the wire electrode 12 is moved in the X-direction relative to the workpiece W.

At step S11, the setting changer 82 changes the setting of the directive acceleration Ac in performing move-and-contact detection. The setting changer 82 may change the setting of the directive acceleration Ac based on the operation of the input unit 60 by the operator or may change the setting of the directive acceleration Ac based on a predetermined program (for example, a program for performing move-and-contact detection). The directive acceleration Ac is set to an appropriate value depending on the diameter and shape of the start hole Wa.

Next, at step S12 the threshold setter 86 sets the threshold Th of the load torque TL. The threshold setter 86 may set a value input through the input unit 60 by the operator as the threshold value Th or may set the threshold value Th based on a predetermined program (for example, a program for performing move-and-contact detection).

Next, at step S13 the motor controller 88 controls the servomotor 56X based on the directive acceleration Ac set at step S11 in performing move-and-contact detection so as to start relative motion of the wire electrode 12 to the workpiece W in the X-direction. Specifically, the supporting member 52 (the workpiece W) as a driver is moved in the X-direction to thereby relatively move the wire electrode 12. The motor controller 88 controls the servomotor 56X so that the relative motion speed V of the wire electrode 12 relative to the workpiece W increases at the rate of the directive acceleration Ac set and changed at step S11.

Next, at step S14 the load torque estimator 84 starts estimating the load torque TL of the servomotor 56X. The load torque estimator 84 estimates the load torque TL of the servomotor 56X based on the current value detected by the current sensor 80X.

Next, at step S15 the motor controller 88 determines whether or not the current load torque TL estimated at step S14 exceeds the threshold value Th. If it is determined at step S15 that the estimated load torque TL does not exceed the threshold value Th, the control directly proceeds to step S17.

On the other hand, if it is determined at step S15 that the estimated load torque TL exceeds the threshold Th, the motor controller 88 controls the servomotor 56X so that the wire electrode 12 is moved relative to the workpiece W in the X-direction at a constant speed (step S16), and the control proceeds to step S17. More specifically, when determining that the estimated load torque TL exceeds the threshold Th, the motor controller 88 controls the servomotor 56X so that the wire electrode 12 keeps moving relative to the workpiece W at the relative motion speed V with which the wire electrode 12 is moving at that moment.

At step S17, the motor controller 88 determines whether or not contact between the wire electrode 12 and the workpiece W (the inner wall of the start hole Wa) is detected by the contact detector 58. If it is determined at step S17 that contact has not been detected, the control returns to step S15 and the above-described operation is repeated. At this time, if it is determined at step S15 that the estimated load torque TL has once exceeded the threshold Th, thereafter the "Yes" branch will be selected at step S15.

If it is determined at step S17 that contact has been detected, the motor controller 88 controls the servomotor 56X so as to stop the relative motion of the wire electrode 12 to the workpiece W. Thereafter, the control device 18A starts a next sequence required for positioning the wire electrode 12.

In order to reduce the impacts in the mechanical system caused by sudden speed reduction when the relative motion of the wire electrode 12 to the workpiece W is stopped, the threshold Th is set at a lower level. This makes it possible to shorten the time for relative motion of the wire electrode 12 in performing move-and-contact detection, prevent breakage of the wire electrode 12 and alleviate the impacts on the mechanical system. In other words, the threshold TH may and should be set such that the impacts in the mechanical system arising due to a sudden speed reduction at the time of stopping the relative motion of the wire electrode 12 becomes a predetermined value or less.

Modified Embodiments

The above-described embodiments can also be modified as follows.

Modified Example 1

In each of the above-described embodiments, the supporting member (driver) 52 is actually moved so that the wire electrode 12 is moved relative to the workpiece W. However, it is also possible to move the wire electrode 12 actually so that the wire electrode 12 is moved relative to the workpiece W. In this case, at least the upper and lower wire guides 32 and 34 move in the X-direction and the Y-direction, and the devices for moving the upper and lower wire guides 32 and 34 in the X-direction and the Y-direction form a driver (corresponding to the supporting member 52 in the first embodiment).

Modified Example 2

In each of the above-described embodiments, though the wire electrode 12 is moved relative to the workpiece W only in one of the X-direction and the Y-direction in performing move-and-contact detection, the wire electrode 12 may be moved relative to the workpiece W simultaneously in the X- and Y-directions. In this case, the motor controller 88 may and should control the servomotors 56X, 56Y such as to perform the relative motion of the wire electrode 12 in the X-direction relative to the workpiece W and the relative motion of the wire electrode 12 in the Y-direction relative to the workpiece W in a synchronous manner.

In this case, the setting changers 70 and 82 may separately change the settings of the directive speed Vc and the directive acceleration Ac in each of the X-direction and the Y-direction. Also, the threshold setter 86 may separately set a threshold Th for each of the X-direction and the Y-direction.

When either one of the load torque TL of the servomotor 56X and the load torque TL of the servomotor 56Y exceeds the threshold Th, it is preferable that the motor controller 88 controls the servomotors 56X, 56Y so that the wire electrode 12 is moved relative to the workpiece W at constant speed in both the X- and Y directions.

Modified Example 3

Though each of the above-described embodiments has been described by giving an example in which the wire electrode 12 is positioned relative to the workpiece W, it is also possible to measure the shape of a measurement target W by moving the wire electrode 12 and the measurement target W relative to each other and detecting contact therebetween. That is, it is possible by acquiring multiple contact positions between the wire electrode 12 and the measurement target W to measure the shape of the measurement target W. In this case, instead of the position determiner 74 or 90, a shape measuring device should be provided.

As described above, in the wire electrical discharge machine 10 (or 10 A) described in the above embodiments and Modified Examples 1 to 3, the wire electrode 12 supported by upper and lower wire guides 32 and 34 and the measurement target W are moved relatively to each other to detect contact therebetween, thereby positioning the wire electrode 12 or measuring the shape of the measurement target W. The wire electrical discharge machine 10 (or 10 A) includes: a supporting member 52 for moving the wire electrode 12 relative to the measurement target W, servomotors 56X, 56Y for moving the supporting member 52, a setting changer 70 (or 82) for changing the setting of a directive speed Vc; and a motor controller 72 (or 88) which, in performing move-and-contact detection for detecting contact between the wire electrode 12 and the measurement target W by making relative motion between two, controls the servomotors 56X, 56Y so that the wire electrode 12 is moved relative to the measurement target W based on the directive speed Vc specified by the setting changer 70 (or 82).

In this way, since the setting of the directive speed Vc for move-and-contact detection can be arbitrarily changed, the wire electrode 12 can be relatively moved at the optimum speed and acceleration in performing move-and-contact detection. Accordingly, it is possible to shorten the time required for the relative motion of the wire electrode 12 in performing move-and-contact detection, prevent the wire electrode 12 from being broken and suppress impacts on the mechanical system due to acceleration/deceleration during the relative motion.

The wire electrical discharge machine 10 includes a contact detector 58 that detects contact between the wire electrode 12 and the measurement target W. The setting changer 70 may also change the setting of a time constant τ. In performing move-and-contact detection, the motor controller 72 may control the servomotors 56X, 56Y so that the relative motion speed V of wire electrode 12 to the measurement target W comes to the directive speed Vc with the time constant τ in performing move-and-contact detection, to thereby move the wire electrode 12 relative to the measurement target W. When contact between the wire electrode 12 and the measurement target W is detected by the contact detector 58, the controller 72 may control the servomotors 56X, 56Y so that the wire electrode 12 moving at the directive speed Vc relative to the measurement target W stops with the time contact τ.

In this way, in addition to the directive speed Vc for move-and-contact detection, the setting of the time constant τ can be arbitrarily changed, so that it is possible to relatively move the wire electrode 12 at a more preferable speed and acceleration in performing move-and-contact detection. Accordingly, it is possible to shorten the time required for the relative motion of the wire electrode 12 in performing move-and-contact detection, prevent the wire electrode 12 from being broken and further suppress impacts on the mechanical system due to acceleration/deceleration during the relative motion.

In this case, the motor controller 72 may control the servomotor so that the relative motion speed V of the wire electrode 12 to the measurement target W varies with acceleration or deceleration of a bell-shaped curve until the time constant τ elapses. This further contributes to improved suppression of impacts on the mechanical system due to acceleration/deceleration during the relative motion.

The wire electrical discharge machine 10A may further include a load torque estimator 84 that estimates the load torque TL of the servomotors 56X, 56Y and a threshold setter 86 that sets a threshold Th of the load torque TL. In performing move-and-contact detection, the setting changer 82 may change the setting of the directive acceleration Ac so as to vary the directive speed Vc with the passage of time based on the directive acceleration Ac until the load torque TL estimated by the load torque estimator 84 exceeds the threshold Th. When the load torque TL exceeds the threshold value Th, the directive speed Vc may be fixed so that the wire electrode 12 is moved relative to the measurement target W at a constant speed.

In this way, the directive acceleration Ac and the threshold value Th in performing move-and-contact detection can be arbitrarily selected, so that it is possible to relatively move the wire electrode 12 at the optimal speed and acceleration in performing move-and-contact detection. Accordingly, it is possible to shorten the time required for the relative motion of the wire electrode 12 in performing move-and-contact detection, prevent the wire electrode 12 from being broken and further suppress impacts on the mechanical system due to acceleration/deceleration during the relative motion.

The wire electrical discharge machine 10A includes a contact detector 58 that detects contact between the wire electrode 12 and the measurement target W. When the contact detector 58 detects contact between the wire electrode 12 and the measurement target W, the motor controller 88 controls the servomotors 56X, 56Y so as to stop the relative motion of the wire electrode 12 to the measurement target W. Thereby, it is possible to prevent the wire electrode 12 from being broken.

Although certain preferred embodiments of the present invention have been shown and described in detail, it should be understood that various changes and modifications may be made therein without departing from the scope of the appended claims.

What is claimed is:

1. A wire electrical discharge machine for positioning a wire electrode supported by upper and lower wire guides or measuring a shape of a measurement target, by moving the wire electrode and the measurement target relatively to each other to detect contact, comprising:
    a driver configured to relatively move the wire electrode to the measurement target;
    servomotors configured to move the driver;
    a setting changer configured to change a setting of a directive speed;
    a motor controller configured to control the servomotors in performing move-and-contact detection for detecting contact between the wire electrode and the measurement target by moving the wire electrode and the measurement target relative to each other, so that the wire electrode is moved relative to the measurement target based on the directive speed; and
    a contact detector configured to detect contact between the wire electrode and the measurement target,
    wherein the setting changer is configured to change the setting of a time constant; and,
    the motor controller is configured to control the servomotors in performing move-and-contact detection so that a relative motion speed of wire electrode to the measurement target comes to the directive speed with the time constant to thereby relatively move the wire electrode to the measurement target, and control the servomotors so that the wire electrode moving at the directive speed relative to the measurement target stops with the time contact when contact between the wire electrode and the measurement target is detected by the contact detector.

2. The wire electrical discharge machine according to claim 1, wherein the motor controller is configured to control the servomotors so that the relative motion speed of the wire electrode to the measurement target varies with acceleration or deceleration of a bell-shaped curve until the time constant elapses.

3. A wire electrical discharge machine for positioning a wire electrode supported by upper and lower wire guides or measuring a shape of a measurement target, by moving the wire electrode and the measurement target relatively to each other to detect contact, comprising:
    a driver configured to relatively move the wire electrode to the measurement target servomotors configured to move the driver;
    a setting changer configured to change a setting of a directive speed;
    a motor controller configured to control the servomotors in performing move-and-contact detection for detecting contact between the wire electrode and the measurement target by moving the wire electrode and the measurement target relative to each other, so that the wire electrode is moved relative to the measurement target based on the directive speed; and
    a load torque estimator configured to estimate load torque of the servomotors; and
    a threshold setter configured to set a threshold of the load torque,
    wherein the setting changer is configured to change a setting of a directive acceleration in performing move-and-contact detection so as to vary a directive speed with a passage of time based on the directive acceleration until the load torque estimated by the load torque estimator exceeds the threshold and fix the directive speed when the load torque exceeds the threshold so that the wire electrode is moved at a constant speed relative to the measurement target.

4. The wire electrical discharge machine according to claim 3, further comprising: a contact detector configured to detect contact between the wire electrode and the measurement target;
    wherein the motor controller is configured to control the servomotors so as to stop a relative motion of the wire electrode to the measurement target when contact between the wire electrode and the measurement target is detected by the contact detector.

5. A measuring method for use in a wire electrical discharge machine that includes: a driver configured to move a wire electrode supported by upper and lower wire guides relative to a measurement target; servomotors configured to move the driver; and a contact detector configured to detect contact between the wire electrode and the measurement target, to position the wire electrode or to measure a shape of the measurement target, by moving the wire electrode and the measurement target relatively to each other to detect contact, comprising:

a setting change step of changing a setting of a directive speed; and, a motor control step of controlling the servomotors, in performing move-and-contact detection for detecting contact between the wire electrode and the measurement target by relatively moving the two relative to each other, so that the wire electrode is moved relative to the measurement target based on the directive speed, wherein:

the setting change step is to change a setting of a time constant; and, the motor control step is to control the servomotors in performing move-and-contact detection so that a relative motion speed of wire electrode to the measurement target comes to the directive speed with the time constant to thereby relatively move the wire electrode to the measurement target, and control the servomotors so that the wire electrode moving at the directive speed relative to the measurement target stops with the time contact when contact between the wire electrode and the measurement target is detected by the contact detector.

6. The measuring method according to claim 5, wherein the motor control step is to control the servomotors so that a relative motion speed of the wire electrode to the measurement target varies with acceleration or deceleration of a bell-shaped curve until the time constant elapses.

7. A measuring method for use in a wire electrical discharge machine that includes: a driver configured to move a wire electrode supported by upper and lower wire guides relative to a measurement target servomotors configured to move the driver; and a contact detector configured to detect contact between the wire electrode and the measurement target, to position the wire electrode or to measure a shape of the measurement target, by moving the wire electrode and the measurement target relatively to each other to detect contact, comprising:

a setting change step of changing a setting of a directive speed;

a motor control step of controlling the servomotors, in performing move-and-contact detection for detecting contact between the wire electrode and the measurement target by relatively moving the two relative to each other, so that the wire electrode is moved relative to the measurement target based on the directive speed;

a load torque estimation step of estimating load torque of the servomotors; and a threshold setting step of setting a threshold of the load torque, wherein the setting change step is configured to change the setting of a directive acceleration in performing move-and-contact detection so as to vary the directive speed with the passage of time based on the directive acceleration until the load torque estimated by the load torque estimation step exceeds the threshold, and fix the directive speed when the load torque exceeds the threshold so that the wire electrode is moved at a constant speed relative to the measurement target.

8. The measuring method according to claim 7, wherein the motor control step is configured to control the servomotors so as to stop a relative motion of the wire electrode to the measurement target when contact between the wire electrode and the measurement target is detected by the contact detector.

* * * * *